United States Patent [19]
Ramakrishnan et al.

[11] Patent Number: 6,040,696
[45] Date of Patent: Mar. 21, 2000

[54] METHOD FOR ESTIMATING PORE STRUCTURE IN CARBONATES FROM NMR MEASUREMENTS

[75] Inventors: Terizhandur S. Ramakrishnan, Bethel; Lawrence M. Schwartz, Westport; Edmund J. Fordham, Danbury; William E. Kenyon; David J. Wilkinson, both of Ridgefield, all of Conn.

[73] Assignee: Schlumberger Technology Corporation, Ridgefield, Conn.

[21] Appl. No.: 08/932,141

[22] Filed: Sep. 16, 1997

[51] Int. Cl.$^7$ .................................................. G01V 3/00
[52] U.S. Cl. ............................................. 324/303; 324/307
[58] Field of Search .............................. 324/303, 300–322

[56] References Cited

U.S. PATENT DOCUMENTS

| | | | |
|---|---|---|---|
| 4,933,638 | 6/1990 | Kenyon et al. | 324/303 |
| 5,291,137 | 3/1994 | Freedman et al. | 324/303 |
| 5,381,092 | 1/1995 | Freedman | 324/303 |
| 5,486,762 | 1/1996 | Freedman et al. | 324/303 |
| 5,680,043 | 10/1997 | Hurlimann et al. | 324/303 |

OTHER PUBLICATIONS

Merriam Webster's Collegiate Dictionary tenth edition p. 655, 843, 1997.
Brigham, W.E., Reed, P.W. and Dew, J.N., "Experiments on mixing during miscible displacement in porous media", Soc. Pet. Eng. J. 1, 1 (1961).
Wyllie, C.R. and L.C. Barrett, Advanced Engineering Mathematics, McGraw–Hill Co., John Wiley & Sons (1995).
Dunham, R.J., In Classification of Carbonate Rocks According to Depositional Texture in Classification of Carbonate Rocks—a Symposium (ed. W.E. Ham), vol. 1, p. 108 *Am. Assoc. Petroleum Geologists Mem.*, Tulsa. (1962). Press, W.H., Numerical Recipes for Fortran, Cambridge University Press (1992).
Schwartz, L., Hurlimann, M.D., Dunn K.J., Mitra P.P., Bergman, D., *J. Phys. Rev.* E55, 4225 (1997).
Schwartz L., Kimminau S., *Geophysics* 52, 1402 (1987).
Zheng L. H., Chew Y.C. J., *Chem. Phys.* 90, 322 (1989).
Agmon N.J., Chem. Phys. 81, 3644 (1984).
Ramakrishnan T.S., Kuchuck F., Transport in Porous Media 10, 103 (1993).
Dubner H., Abate J., *Assn. Comp. Mach.* 15, 115 (1968).

*Primary Examiner*—Christine K. Oda
*Assistant Examiner*—Tiffany A. Fetzner
*Attorney, Agent, or Firm*—Mark Levy; William B. Batzer

[57] ABSTRACT

In this invention a new interpretation methodology has been developed. A pore structure model is used to compute the relaxation behavior. This model is then used as the kernel of a best-fit inversion scheme against the measured data, in contrast to inverting for a $T_2$ distribution that relies on regularization. Parameters of the model are obtained by "best fitting" the model with the data. The method considers a geometrical or physical model comprising both intergranular and intragranular porosity (microporosity). The NMR relaxation is computed by one of the several methods. The model is compactly represented by a set of physical parameters that are iterated upon until a match with relaxation data is obtained in the best fit sense. The result is obtained in terms of these physical parameters, and then integrated with other types of measurements.

19 Claims, 9 Drawing Sheets

METHOD FOR ESTIMATING PORE STRUCTURE IN CARBONATES FROM NMR MEASUREMENTS

FIELD OF THE INVENTION

The invention relates to a method for determining the pore geometry in microporous carbonate rocks and, more particularly, to a pore structure model that is used to compute the relaxation behavior. The method is particularly applicable to grain supported carbonates. This method does not soley rely on the inversion of NMR data to produce a $T_2$ distribution but, rather, on the best fitting of the pore structure model directly to the NMR data. A $T_2$ distribution is however available as an ancillary output.

BACKGROUND OF THE INVENTION

Nuclear Magnetic Resonance (NMR) refers to response of nuclear magnetic moments to a combination of static and radio-frequency magnetic fields. These nuclear magnetic moments can interact with externally-applied magnetic fields, producing measurable signals. The hydrogen nucleus has a relatively large magnetic moment and is abundant in both water and hydrocarbon in the pore space of rock. By tuning NMR logging tools to the magnetic resonance frequency of hydrogen, the signal is maximized. NMR signal amplitude is proportional to the number of hydrogen nuclei present and is calibrated to generate signals with amplitude proportional to porosity. The decay of the NMR signal during each measurement cycle is represented by a decay curve $M_d(t)$. This decay curve is related to the underlying distribution of pore sizes. Small pores tend to produce decay at short times, whereas large pores result in decay at long times. Borehole instruments, used in well logging, are capable of measuring the transverse relaxation decay curve. A description of how transverse relaxation is measured and used in the field of oil reservoir identification can be found in U.S. Pat. No. 5,381,092 for "Method and Apparatus for Compressing Data Produced from a Well Tool in a Wellbore Prior to Transmitting the Compressed Data Uphole to a Surface Apparatus" issued to Robert Freedman on Jan. 10, 1995.

NMR, as a well logging technique, does not always yield useful results. Part of the problem with NMR interpretation is a consequence of faulty assumptions, particularly as they apply to carbonate rock. Carbonates are especially troublesome, because their complex microgeometry renders invalid any precise relationship between the $T_2$ distribution and the pore size distribution. Conventional interpretation of NMR measurements is based on a number of assumptions, to wit:

1. In addition to the bulk relaxation mechanism, magnetization decays because water molecules diffuse to the surface of the grain where they experience an enhanced relaxation rate. This is believed to be a result of their interaction with magnetic fields associated with paramagnetic impurities in the grains.

2. The pore space is divided into separate pores that do not interact with each other. But within each pore, magnetization is assumed to be spatially uniform and to undergo single exponential decay with lifetime $T_2$. The basis for the latter assumption is that $\rho V_s/D \ll 1$, where D is the diffusion coefficient in the bulk fluid, $V_S$ is the volume-to-surface ratio of the individual pore, and $\rho$ is the surface relaxivity. The characteristic decay time constant of spin—spin relaxation of any pore is then given as:

$$1/T_2 = \rho/V_s + 1/T_{2b}$$

where $T_{2b}$ is the bulk relaxation time. Note that the above equation establishes a one-to-one relation between the decay rate $1/T_2$ for a given pore and the pore size parameter $V_s$.

3. Based on assumption (2) above, the magnetization decay from the entire rock sample can be represented as the sum of contributions from separate pores. The associated probability volume density function (pvdf) of lifetimes, $g(T_2)dT_2$ is the fraction of pores whose characteristic $T_2$ lies between $T_2$ and $T_2+dT_2$, where $$\int_0^\infty g(T_2) dT_2 = 1.$$

The measured NMR signal $M_d(t)$, when normalized to one, can be written as $$M_d(t) = \int_0^\infty g(T_2) \exp(-t/T_2) dT_2$$

In practice, the measured signal is inverted to estimate $g(T_2)$. Again, because of assumption 2, $g(T_2)$ is thought to represent the pore size distribution.

The aforementioned (2) and (3) assumptions are flawed in general, and in particular, do not hold for carbonate rocks. The measured decay is not readily translatable to pore Sizes. Inverted $T_2$ distributions in grain supported carbonates are often unimodal, whereas petrography studies show them to be at least bimodal. Petrographs show that the grains are composed of micrite (microscopic calcite) particles. The pore space between the grains consists of intergranular porosity. The intergranular porosity tends to have pore sizes significantly larger than that of the intragranular porosity. Since these two types of pores of diverse sizes are juxtaposed with a sufficiently large interfacial area between them, the diffusion of magnetic moments between them causes the breakdown of the assumed relationship between the $T_2$ distribution and the pore size distribution.

In this invention, a new methodology is developed that differs significantly from the conventional approach. The inventive method first considers a model comprising a geometrical arrangement of grains with internal porosity. The NMR relaxation of such a modal is computed by one of several methods discussed hereinafter. The model is reduced to a set of physical parameters which are then adjusted so as to match the relaxation data as well as possible. The result is obtained in terms of these physical parameters, and then integrated with other types of measurements. In the prior art, relaxation data is used directly as the interpretative tool. A $T_2$ distribution, $g(T_2)$ is estimated from $M_d(t)$ using established signal processing techniques. A pore structure model is then inferred using Assumption 2, above. In this invention, a pore structure model with all of the magnetization relaxation physics included, is used to invert the data. In particular, Assumption 2 is not made; diffusive interaction between pores is allowed and modeled explicitly. Parameters of the model, which represent the pore geometry, are obtained by "best fitting" the model with the data.

SUMMARY OF THE INVENTION

In accordance with the present invention, there is provided a method of determining the pore geometry of carbonate rocks containing microporosity, in particular grain supported carbonates. This geometry is important because of its connection with geological characterization, permeability, resistivity, acoustic propagation, etc. Historically, the $T_2$ distribution in carbonates is associated with the pore size distribution. This association of pore size with $T_2$ breaks down in many pore systems, especially carbonates, which consist of micro (intragranular) and macro (intergranular) porosity. Therefore, rock property estimates (e.g., permeability, resistivity, etc.) based on such associations also tend to fail.

In this invention a new interpretation methodology has been developed. A pore structure model is used to compute the relaxation behavior. This model is then used as the kernel of a best-fit inversion scheme against the measured data, in contrast to inverting for a $T_2$ distribution that relies on regularization. Parameters of the model are obtained by "best fitting" the model with the data. The method considers a geometrical or physical model comprising both intergranular and intragranular porosity (microporosity). The NMR relaxation is computed by one of the several methods. The model is compactly represented by a set of physical parameters that are iterated upon until a match with relaxation data is obtained in the best fit sense. The result is obtained in terms of these physical parameters, and then integrated with other types of measurements.

It is an object of this invention to provide a new method of estimating absolute pore sizes and porosity components, and thus deducing the pore structure of carbonate rocks. It is another object of the invention to provide an improved method of using relaxation data to estimate absolute pore sizes and porosity components.

It is still another object of this invention to provide a new method that uses a model based on realistic physics, comprising a set of physical parameters, which are then adjusted so as to match relaxation data as well as possible, in estimating absolute pore sizes and porosity components.

BRIEF DESCRIPTION OF THE DRAWINGS

A complete understanding of the present invention may be obtained by reference to the accompanying drawings, when considered in conjunction with the subsequent detailed description. In these drawings and the subsequent discussion the porosity, $\phi$, is described in terms of an intragranular fraction, $\phi_\mu f_g$, and a macro (intergranular) fraction, $f_m$. Here $f_g+f_m=1$, and $f_m+\phi_\mu f_g=\phi$, where $\phi_\mu$ is the porosity fraction within the microporous grains.

FIG. 4a depicts a series of graphs showing the $T_2$ distribution results from numerical simulations for an uncoupled, intergranular pore system and its microporosity;

FIG. 4b shows a series of graphs showing the $T_2$ distribution results from numerical simulations for a coupled intergranular pore system and its microporosity;

FIG. 4c illustrates a series of graphs showing the $T_2$ distribution results from numerical simulations including a partial hydrocarbon saturation effect in a mixed porosity system. In this illustration the hydrocarbon entirely fills the intergranular pore but has not invaded the microporous grain;

FIG. 4d shows a series of graphs showing the $T_2$ distribution results from numerical simulations for a coupled Intergranular pore system and its microporosity. Here the mix of micro and intergranular porosity is different from that in FIGS. 4a–4c;

DESCRIPTION OF THE PREFERRED EMBODIMENT

Five different models (two having the same geometry, but different methods of solution) are considered in this disclosure, but other schemes and further refinements are possible, as will be apparent to the skilled practitioners of this art. Briefly, the models are:

1. Quasistatic relaxation model, having only partial interaction between inter- and intragranular pores included. The intragranular pores are contained within a spherical microporous grain. There are four independent geometrical parameters. The geometry for diffusion paths within the microporous grain can be changed in accordance with other data.

2. Numerical random walk simulation models. No continuum assumption is made here. For any packing chosen, these calculations provide first principles results for NMR decay and other transport calculations. The model is used for forward calculations, but could in principle be used for inverse calculations.

3. Analytical 3-D model solved by numerical inversion of Laplace transforms. The intragranular pores are contained within a spherical microporous grain. There are four independent geometrical parameters. The geometry for diffusion paths (tortuosity) can be arbitrarily changed in accordance with other data.

4. Analytical 3-D model solved by direct time domain analysis. The intragranular pores are contained within a spherical microporous grain. There are four independent geometrical parameters. The geometry for diffusion paths (tortuosity) can be arbitrarily changed in accordance with other data.

5. Analytical I-D model solved by analytical Laplace inversion followed by time domain analysis. There are four independent geometrical. parameters with microporous grains that are represented by a linear geometry. The geometry for diffusion paths (tortuosity) can be arbitrarily changed in accordance with other data.

Model nos. 3 and 4, above, are of the same geometry, but have different methods of solution. In practice a combination of the aforementioned two methods can be implemented for inversion. Analogous to this, the 1-D model no. 5 can also be inverted numerically, or by direct time domain methods, resulting in five models, but nine methods of solution.

Figure 1:
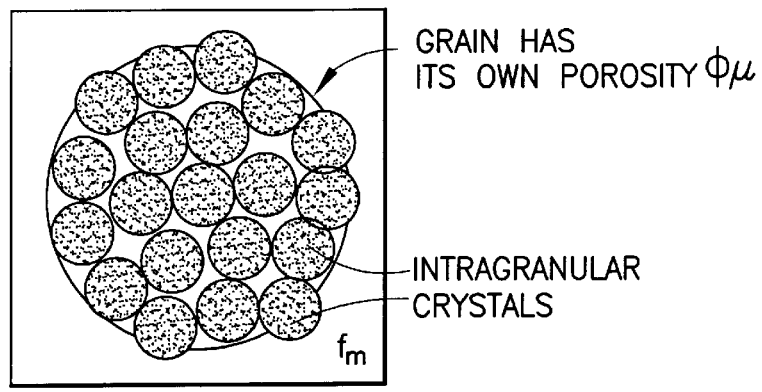
FIG. 1 illustrates a schematic diagram of a unit cell of intergranular and intragranular porosity for carbonates.

Now referring to FIG. 1, an arrangement of inter- and intra-granular porosities is shown for a unit cell. Starting with the simplest model, the concept of apparent relaxivity is herein explained. The petrography results in certain grainstones and packstones that are indicative of a bimodal pore size distribution. However, this bimodal character is not reflected in the $T_2$ spectra of the corresponding relaxation data. This anomaly is explainable by the concept of apparent relaxivity. The diffusion of magnetic moments from the intergranular fraction $f_m$ into the intragranular pore space leads to an enhanced relaxation of magnetization compared to the relaxation results obtained if the two types of pores were isolated from each other.

Figure 2:
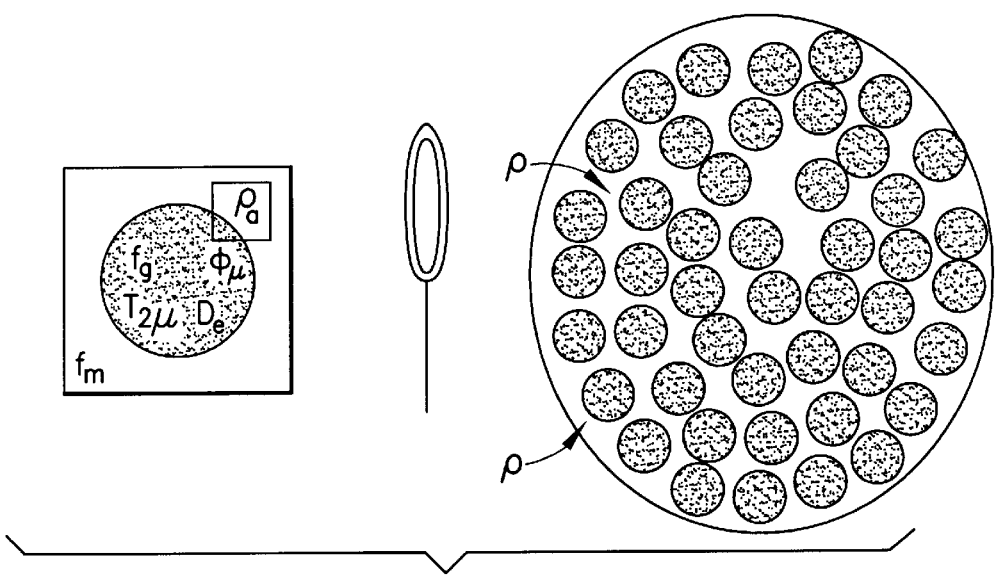
FIG. 2 depicts a schematic diagram of enhanced relaxivity due to microporous grains. Within the microporous grain the NMR transverse lifetime is $T_{2\mu}$ and the effective diffusion coefficient is $D_e$.
Figure 3:
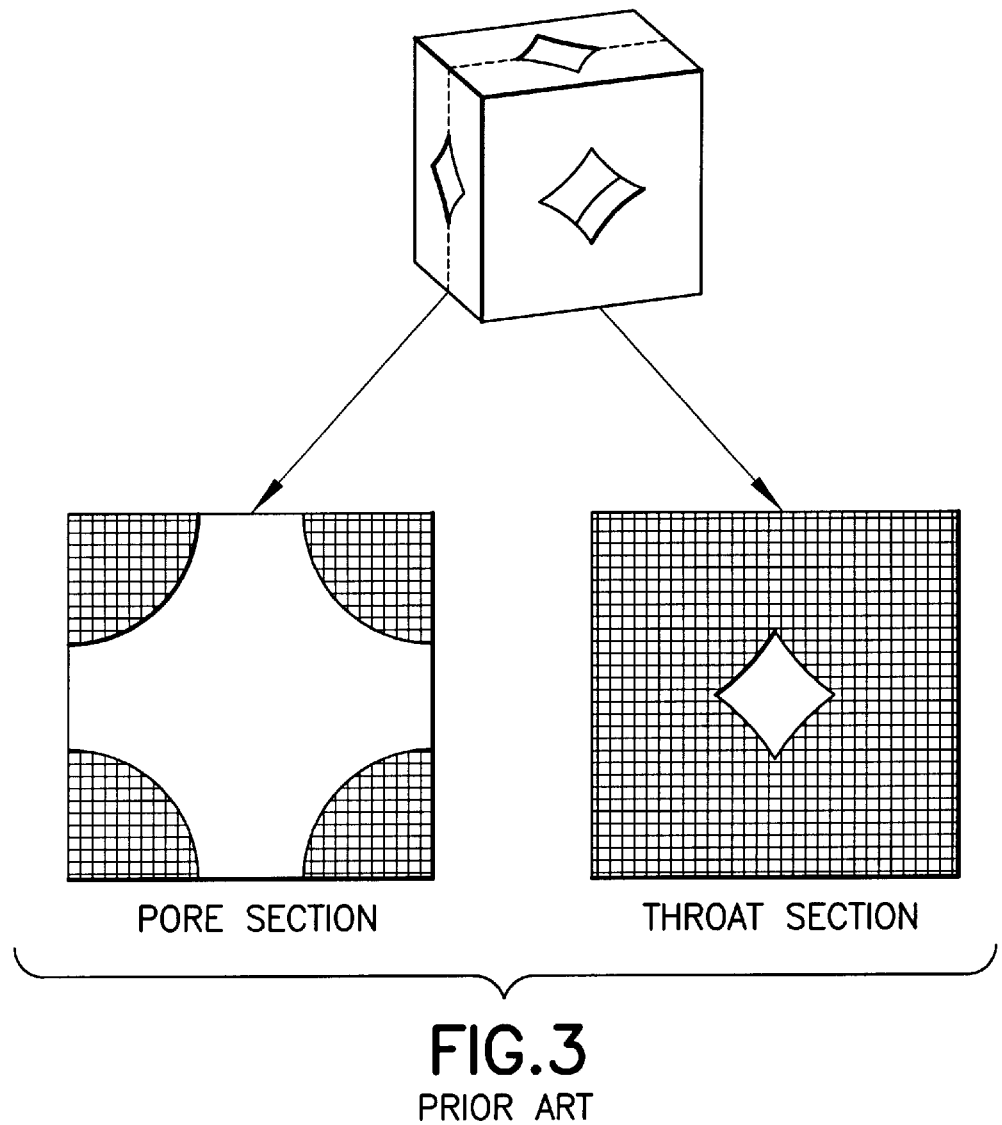
FIG. 3 shows a diagrammatic model representing a microporous grain consolidation model.

Referring to FIG. 2, the enhanced relaxivity is due to the microporous grain, as illustrated. Let $T_{2\mu}$ be the relaxation time constant within the grain in the continuum limit. The continuity equation for the magnetization in the intragranular pore space obeys:

$$D_e \nabla^2 M_\mu - \phi_\mu \frac{M_\mu}{T_{2\mu}} = \phi_\mu \frac{\partial M_\mu}{\partial t} \quad (1)$$

where $D_e$ is the effective diffusion constant=$D/F_\mu$, and $F_\mu$ is the formation factor of the microporous grain[1]. Suppose that the magnetization at the surface of this grain varies only over times much longer than the decay time, $T_{2\mu}$. The transient term in Equation (1) may then be ignored to get a quasistatic equation for $M_\mu$. Given a grain radius $r_g$, the quasisteady equation can be solved subject to the boundary condition that at $r=r_g$ $$M_m = M_\mu \quad (2)$$

and $$D \frac{\partial M_m}{\partial n} = D_e \frac{\partial M_\mu}{\partial n} + \rho M_m (1 - \phi_\mu) = \rho_a M_m \quad (3)$$

where n denotes the derivative along the unit normal out of the grain, $M_m$ is the magnetization in the intergranular pore space, and $\rho_a$ is the apparent relaxivity for the intergranular pores. Solving the quasisteady equation, the magnetization in the intergranular is found to relax as if the microporous grain were replaced by a solid grain with the apparent relaxivity:

$$\rho_a = \rho(1 - \phi_\mu) + \left[\sqrt{\frac{\phi_\mu D}{F_\mu T_{2\mu}}} \coth\left(\sqrt{\frac{\phi_\mu F_\mu}{D T_{2\mu}}} R\right) - \frac{D}{F_\mu R}\right] \quad (4)$$

Substituting typical numbers suggests that one might reasonably find an order of magnitude increase in relaxivity compared to that estimated from intrinsic $\phi$ values. This suggests that the apparent pore size of an intergranular pore may appear to be substantially smaller than its true value. Therefore, the $T_2$ distribution cannot be directly related to the pore size distribution by a simple scale shift.

An approximate expression for NMR relaxation in carbonates with micro and macro porosity based on the apparent relaxivity concept is:

$$M(t)=(\phi-f_m) \exp(-t/T_{2\mu})+f_m \exp(-\rho_a t/V_{sm}) \quad (5)$$

where $V_{sm}$ is the ratio of the volume of the macro pore to the external surface area of the grain in the continuum representation. Equation (5) is a two-exponential fit to the relaxation data in carbonates. It again divides the population into two groups as dictated by the geometry, but takes into account enhanced relaxation through diffusion into intragranular pores.

Equation (5) suffers from two drawbacks: a) the time scale for macro pore relaxation is not significantly different from $T_{2\mu}$, because $\rho_a$ is an order of magnitude larger than $\rho$ (the quasistatic approximation therefore introduces errors); and b) the boundary conditions of Equations (2) and (3) are not satisfied. Despite these limitations, when the two pore sizes are sufficiently well separated, and for a range of $\rho$ as shown below, the quasistatic approximation is useful. A fit in the form of Equation (5) can then be used as a first pass for deducing component fractions.

Numerical Simulation

A complete evaluation of the consequences of diffusion between inter- and intra-granular components may be carried out through numerical random walk simulation. The random walkers are magnetic moments that are allowed to relax at the wall with a specified killing probability γ representing the surface relaxivity. The random walk simulations are, in effect, computer experiments that provide important physical insight to the relation between the magnetization decay curve and the underlying distribution of pore sizes.

The geometry for the numerical simulation is a simple cubic packing of grains, each of which comprises smaller spherical particles whose centers lie on a commensurate sub-lattice. This model is defined by four geometrical parameters: the radii of the large and the small grains, and the absolute lengths of the large and small unit cells. Because the model allos for consolidation or overlapping of both the large and small spheres, the final grain shapes are not necessarily spherical.

Figure 4A:
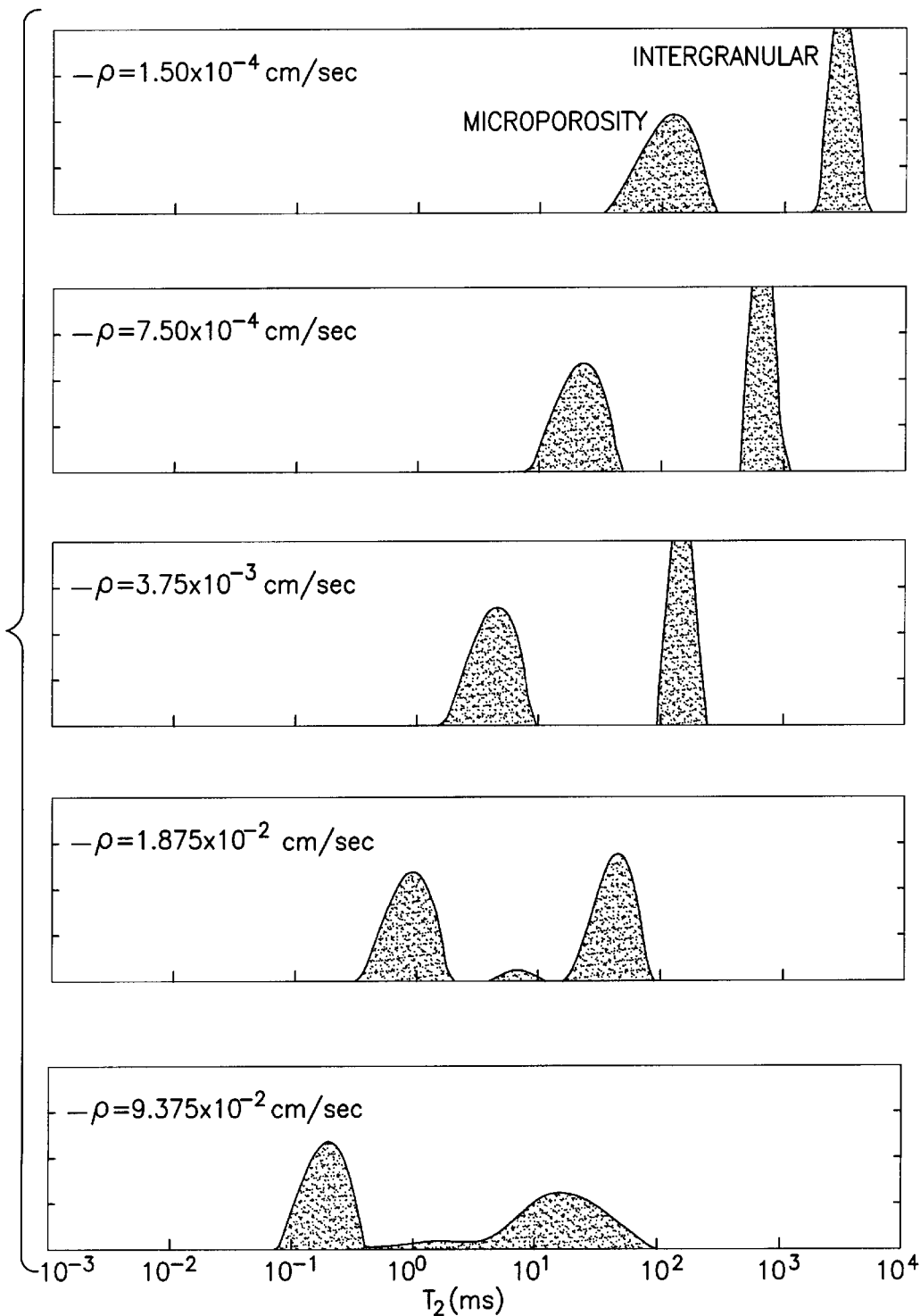
FIGS. 4a–4d illustrate a series of graphs depicting the $T_2$ distribution results from random walk numerical simulations for inter- and intra-granular pore systems; specifically.
Figure 4B:
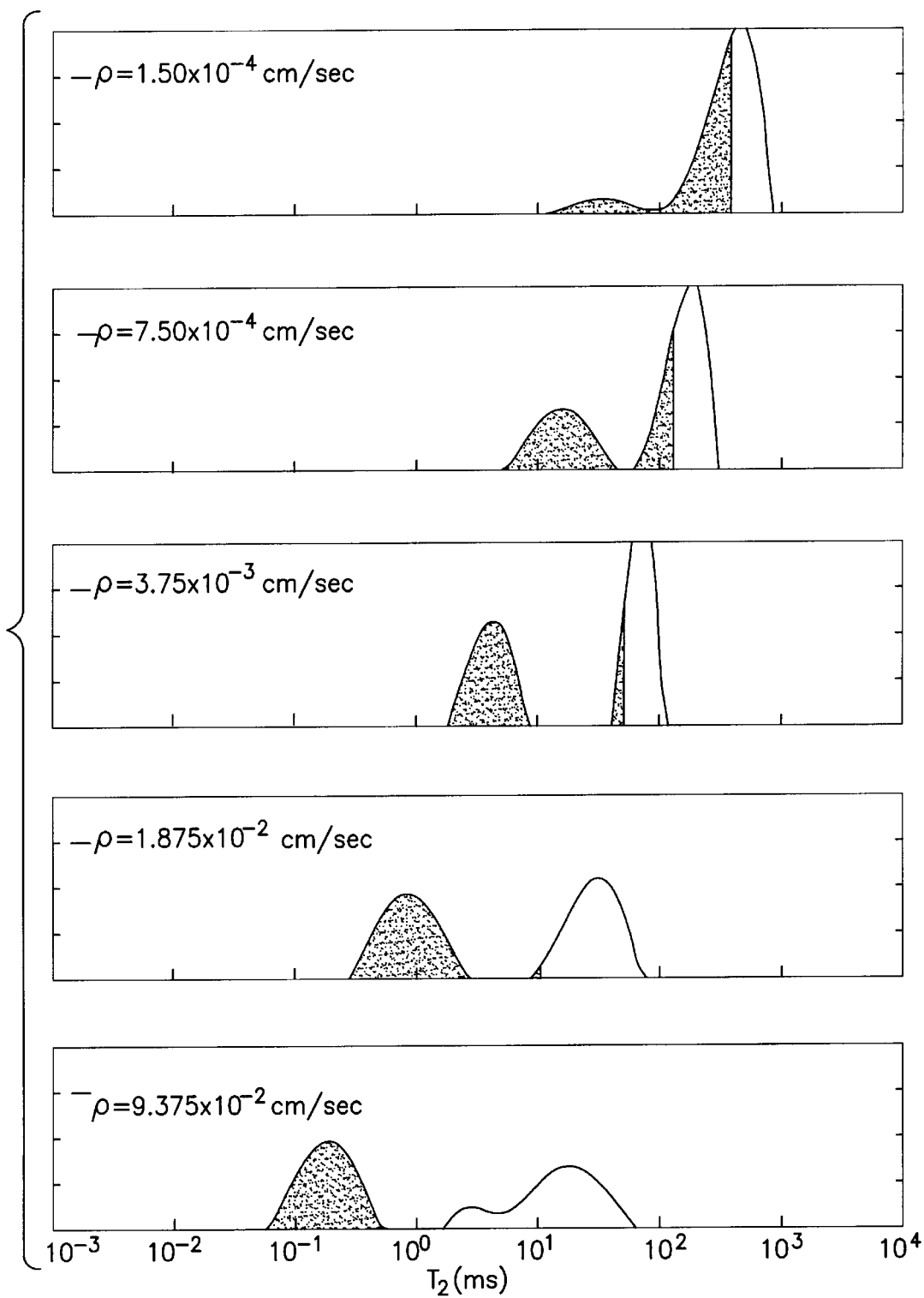
Figure 4C:
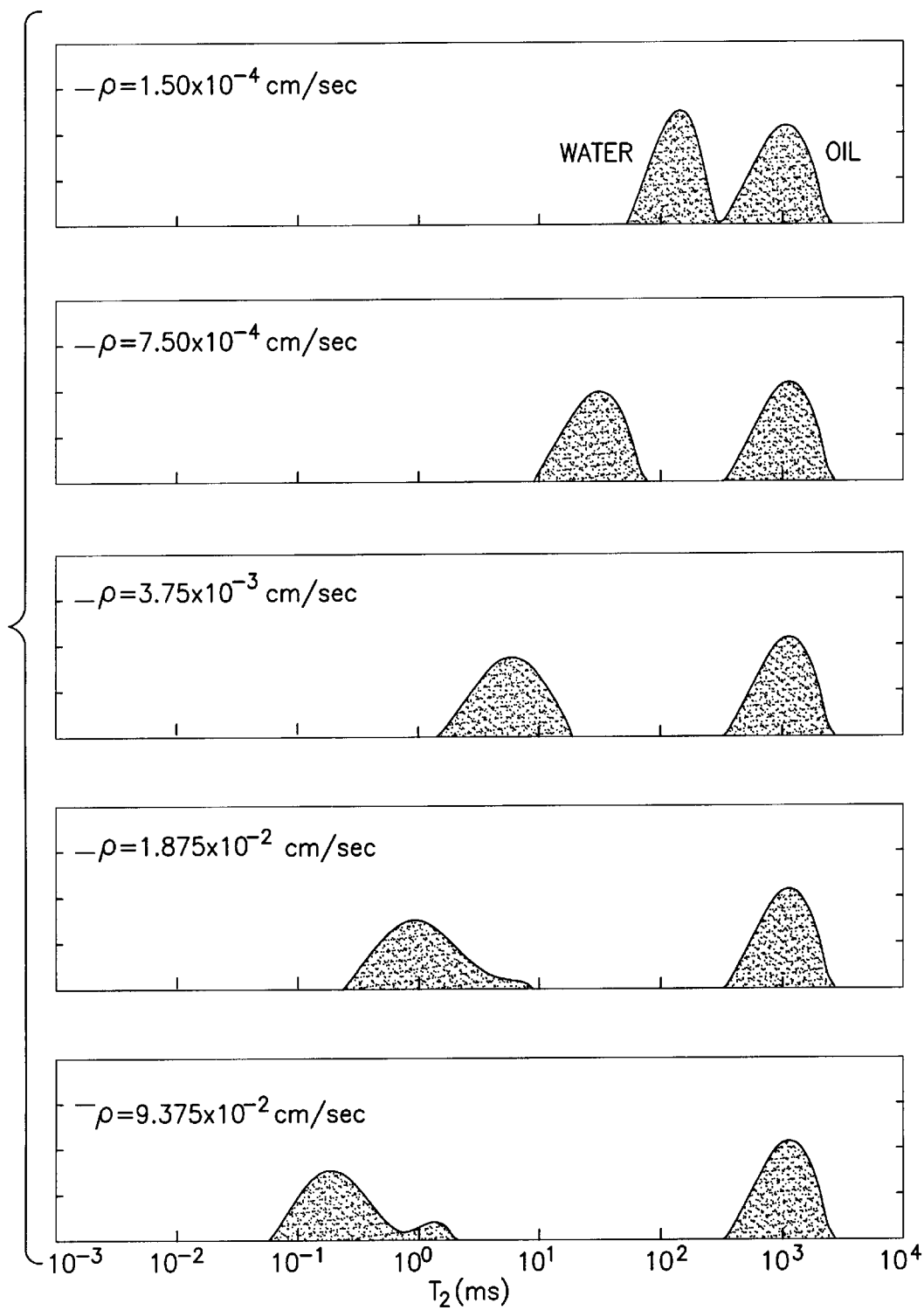

The simulation results for a particular choice of the four geometrical parameters are shown in FIGS. 4a–4c. In this example the total porosity, $\phi$=0.31, and $f_m$=0.14, the edge of the large unit cell is 80 $\mu$m and the edge of the small unit cell is 2 $\mu$m. In each of FIG. 4, the computed $T_2$ distributions are shown for five different values of $\rho$. The area fraction in the shaded region is equal to that of the microporosity. The lowest value of $\rho$ (upper panel) is representative of reservoir carbonates. At this value of $\rho$, the $T_2$ distribution appears just as in the experiments (essentially unimodal, with insufficient character to separate the two contributions). The movement of the larger $T_2$ peak towards the shorter peak illustrates the enhanced relaxivity concept. The quasistatic approximation does explain this enhanced relaxivity of intergranular pores. As can be seen in FIGS. 4a–4c, considering intermediate values of $\rho$, where the shaded region does not spill over to the larger $T_2$ part, the two exponential relaxation model of Equation (5) is applicable. Referring specifically to FIG. 4c, it can be seen that it is possible to extend the methods described herein to accommodate hydrocarbon presence in the pore space.

Figure 4D:
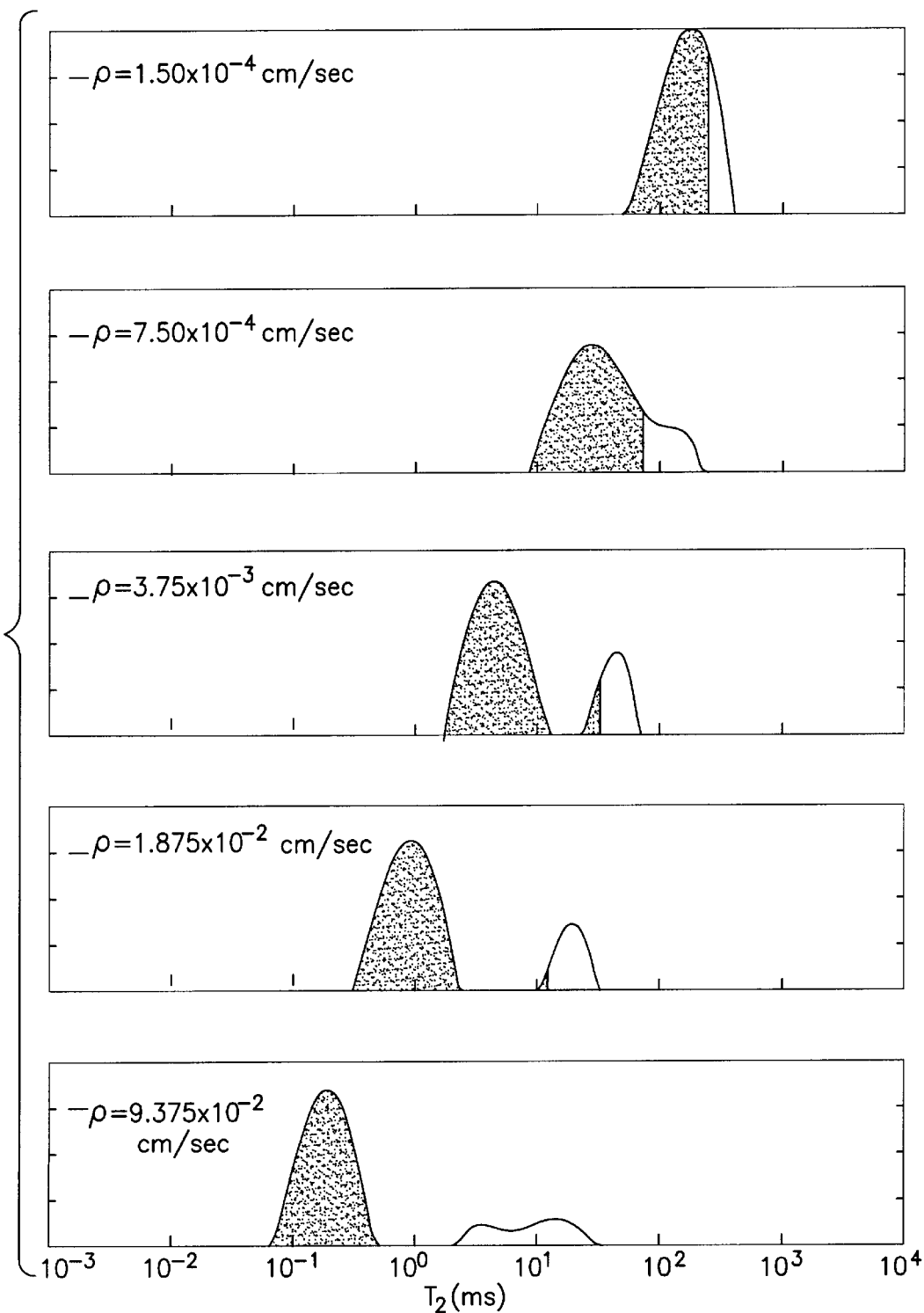

Simulation results for a different choice of the four geometrical parameters is shown in FIG. 4d. Here the $\phi$=0.25, and $f_m$=0.05. The large and small unit cell sizes and the values of $\rho$ are the same as in FIGS. 4a–4c. Again, the area fraction in the shaded region is equal to that of the microporosity and, at the lowest value of $\rho$, the $T_2$ distribution has entirely lost its bimodal character.

Analytical Models

To carry out a robust interpretation that can be implemented in practice, three requirements are necessary:
(i) a forward model should be provided that faithfully captures all of the relevant physics,
(ii) a computation should be sufficiently fast for inverse solution, and
(iii) without being unduly complicated, a parameterization that adequately represents the physical geometry should be provided. In view of the limited signal-to-noise ratio of NMR measurements, it is unlikely that more than three or four parameters can be estimated. These are reasonably represented by the analytical models described below.

Non-steady State Model for Spherical Geometry (3-D Model)

The random walk simulations are captured in their entirety by the three dimensional (3-D) model of FIG. 1. Solving Equation (1) without dropping the transient terms and combining this with a similar equation for the intergranular pore space yields a mathematical complexity that is enormous. This is because the problem entails a combination of Cartesian and spherical geometry. As per the third requirement above, a considerable level of simplicity may be achieved without sacrificing numerical accuracy by realizing that, for the intergranular pore $\rho_a/(V_{sm}D) \ll 1$, and therefore, spatial gradients in $M_m$ are negligible. In such a case, an arbitrary geometry for the intergranular pore may be considered. Having made this approximation, in addition to Equation (1), the magnetization in the intergranular pore, $M_m$ described by $$-V_{sm}\frac{dM_m}{dt} = D_e \frac{\partial M_\mu(r_g)}{\partial r} + \rho M_m(1-\phi_\mu) \quad (6)$$

must be considered. For the unit cell model, given a porosity $\phi = f_m + (1-f_m)\phi_\mu$, only three parameters are required: $f_m$, $T_{2\mu}$, and $V_{sm}$. All of the other geometric parameters, such as $r_g$, can be expressed in terms of these three. Porosity $\phi$ itself may be regarded as one of the parameters if it is otherwise unavailable. The intrinsic relaxivity, the diffusivity and the cementation factor within the grain are independently available, as is explained hereinafter.

The solution to the above problem can be obtained in a variety of ways: an extension of the standard eigenfunction methods in time domain (see Wyllie, C. R. and L. C. Barrett, ADVANCED ENGINEERING MATHEMATICS, McGraw-Hill Co., John Wiley & Sons (1995)) ( or Laplace transformation, which can be inverted both analytically and numerically. Three different methods of solution are therefore possible. The computational advantage of one over the other depends on the nature of the problem. Once the spatial profile for $M_\mu$ is obtained for any given time, its value at $r=r_g$ gives $M_m$. The integral of $M_\mu$ over the volume of the spherical grain gives the contribution from the grain. Let $$\hat{M}_\mu$$

be the volume average value per unit pore volume of the grain $(4/3)\pi r_g^3 \phi_\mu$. Then the observed magnetization is:

$$M(t) = (\phi - f_m)\hat{M}_\mu(t) + f_m M_\mu(r_g, t) \quad (7)$$

Figure 5A:
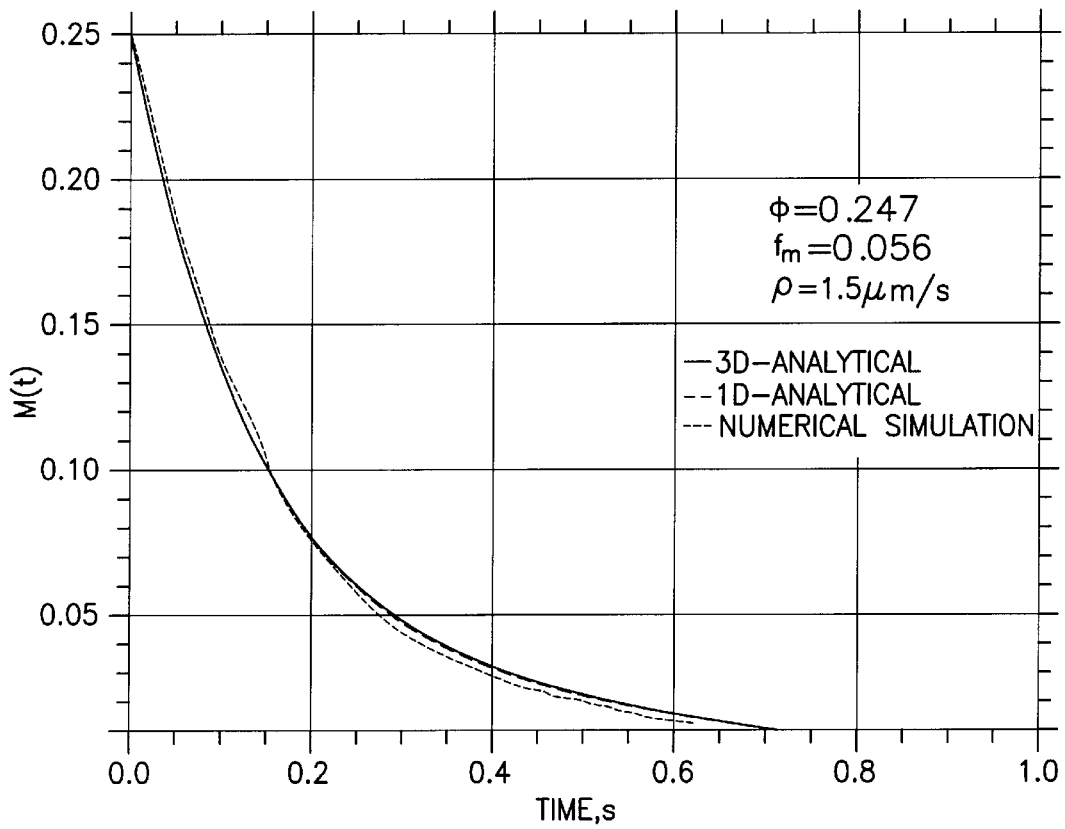
FIG. 5a depicts a graphical comparison of numerical simulation of M(t) with analytical models.
Figure 5B:
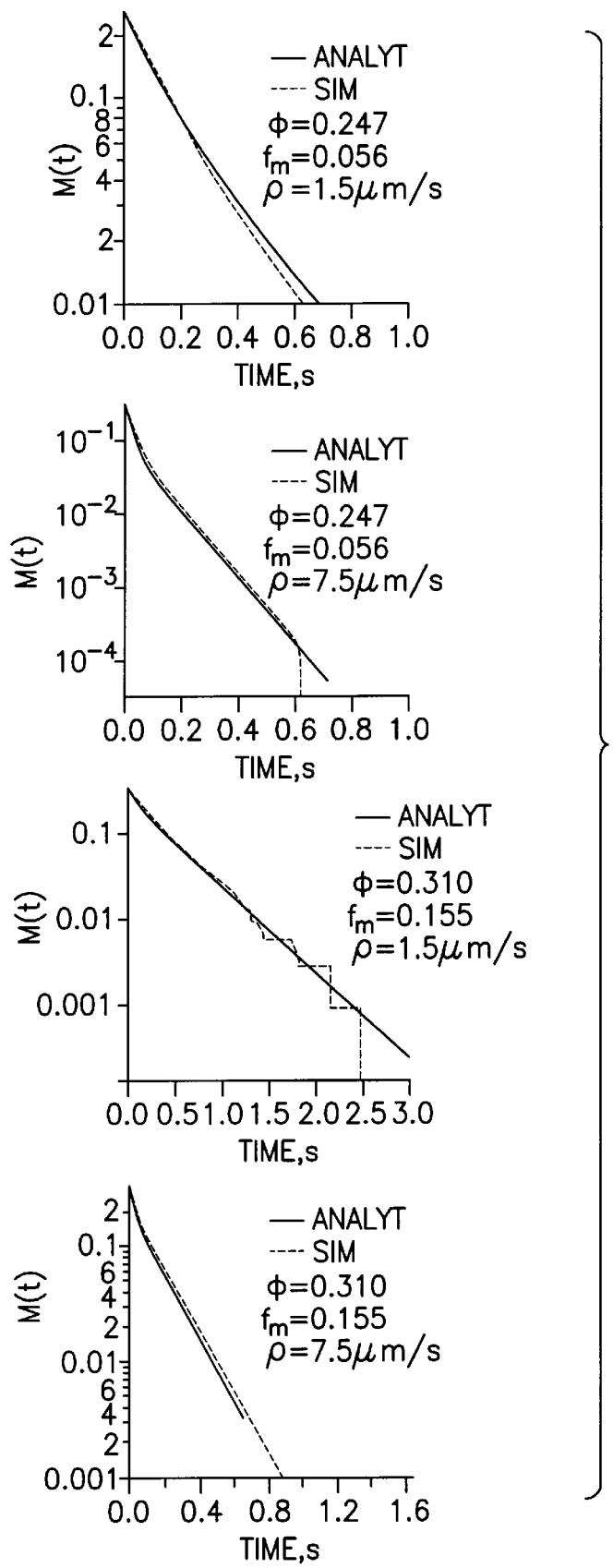
FIG. 5b depicts a graphical comparison of numerical simulation with the three-dimensional analytical models for a range of parameters.

The results from this model are compared with the numerical simulation in FIGS. 5a and 5b. The comparison is excellent. The three requirements as stated above may be considered to be met. The result given by Equation (7) can be used for direct model-based data interpretation.

Non-steady State Model in Rectilinear Geometry (1-D Model)

Figure 6:
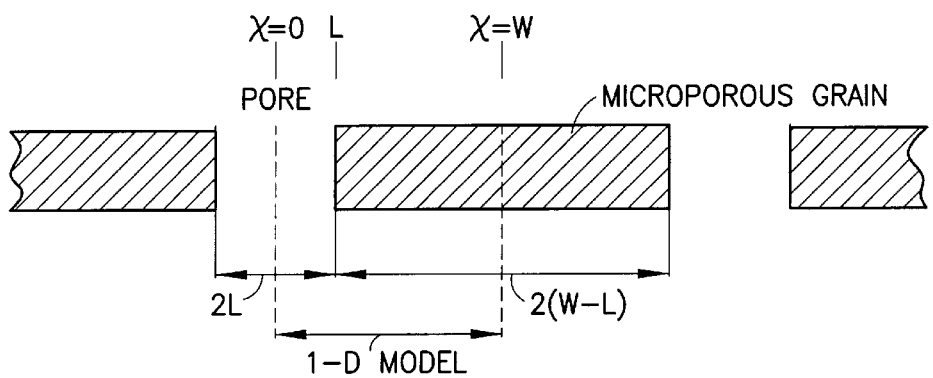
FIG. 6 shows a schematic diagram of a unit cell geometry for the one dimensional, unsteady state model.

In the 3-D model, the magnetization in the intergranular pore is "well mixed." Since the outer boundary can be of arbitrary shape, analytical solutions with diffusion terms are not easy to obtain. Therefore, a linear problem (FIG. 6) was considered. The governing equations are similar to the 3-D model, except that the intergranular pore is also described by an equation similar to Equation (1). In the 1-D model, $f_m = L/W$.

As aforementioned, the problem is solved through Laplace transformation. The solution to the 1-D problem is also shown in FIG. 5. The agreement between the analytical models is excellent in this case. As the penetration length due to diffusion becomes comparable to $r_g$, however, the two model results may differ.

Eigenmodes

Figure 7:
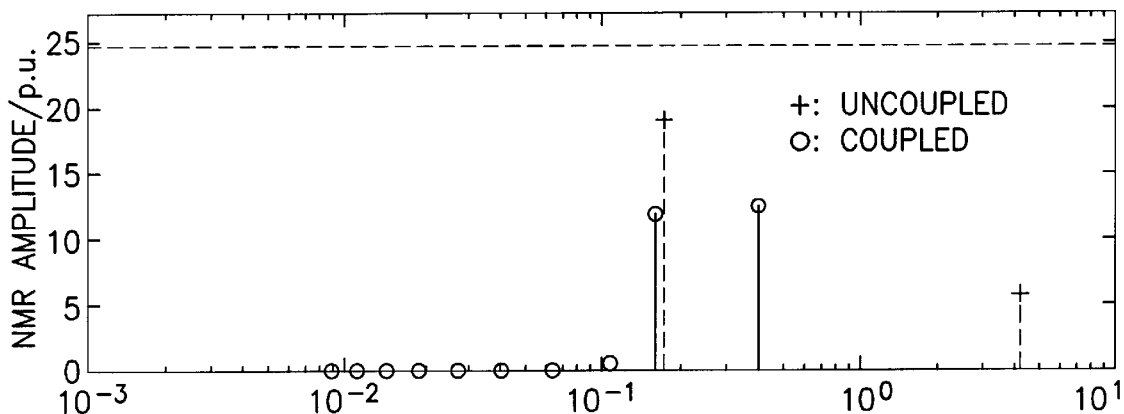
FIG. 7 illustrates a schematic diagram of eigenmodes and their corresponding amplitudes in the 1-D model.

An eigenmode analysis can be carried out for both the 3-D and the 1-D geometries. An example of the eigenmode analysis is shown in FIG. 7. The eigenmode analysis, when carried out for the 3-D geometry, shows qualitatively similar behavior to that of the 1-D model. A distribution of the magnitudes of the eigenmodes clearly shows that they are not directly comparable to the relevant pore sizes. The intergranular pore contribution is enhanced by the "overlap." Its relaxation time decreases considerably due to the enhanced relaxivity. $T_{2\mu}$ is reduced by a small amount, and a number of eigenmodes with smaller time scales appear, but their relative contribution is minor in this case (FIG. 7). The dashed spikes seen in the figure are the magnitudes of the modes of the micro and the macro pores, if there were no interaction. The solid spikes are the amplitudes when the two pore systems have a finite diffusive interaction.

Additional Models

It can be observed that based on the spherical and the linear geometries, other geometries, constructed along the same lines, may be solved. For example, the grains may be assumed to be cylindrical, elliptical or ellipsoidal. The principle behind the invention presented here is equally applicable to these geometries as well.

Algorithm for Data Interpretation

The invention comprises a new method for interpreting the magnetization relaxation data. In the conventional method, the relaxation data is understood to be a sum of a large number of exponential decays, each with its own (pre-selected) $T_2$, and with its own amplitude.

From the analysis above, it is evident that the obtained $T_2$ values have little connection with the characteristic pore sizes of the rock. Rather than reducing the relaxation data into such a distribution of $T_2$ values through available signal processing methods, a forward model and inversion algorithm is herein proposed.

As an example, the geometric model for the 3-D problem has the following parameters: $\phi$; grain radius $r_g$; $V_{sm}$; $r_m$, the characteristic spherical distance in the macro pore ($\approx V_{sm}$); $T_{2\mu}$; D; $\rho$; $f_m$; $\phi_\mu$; and $F_\mu$. Not all of these are independent, due to the geometry.

Considering a unit cell in the periodic arrangement of grains fixes the relationships among some of them. For example, $$\phi_\mu = \frac{\phi - f_m}{1 - f_m} \quad (8)$$

$$\frac{f_m}{\phi - f_m} = \frac{3r_m}{\phi_\mu r_g} \quad (9)$$

The formation factor Fp is given by:

$$F_\mu = \frac{1}{\phi_\mu^{m_\mu}} \quad (10)$$

where $m_\mu$, is the cementation exponent within the grain. This is assumed to be known from independent information. Also, from geometrical considerations, $V_{sm}$ is a known function of $r_m$. This gives four equations among ten parameters. Six unknowns are extant. Since D is known for a given pressure and temperature, the number of unknowns is reduced to five. Laboratory experiments for estimating ρ indicate that the intrinsic relaxivity varies from 1 to 4 μm/sec. For a given region, default values may be obtained.

At this point, two choices are available. In the first option, total porosity may be fixed by independent measurements, say from nuclear tools; the number of unknown parameters is then reduced to three. Four parameters must be obtained. If the porosity is allowed to float. The compromise is an increased uncertainty in the inverted parameters, when independent porosity measures are not used.

Figure 8:
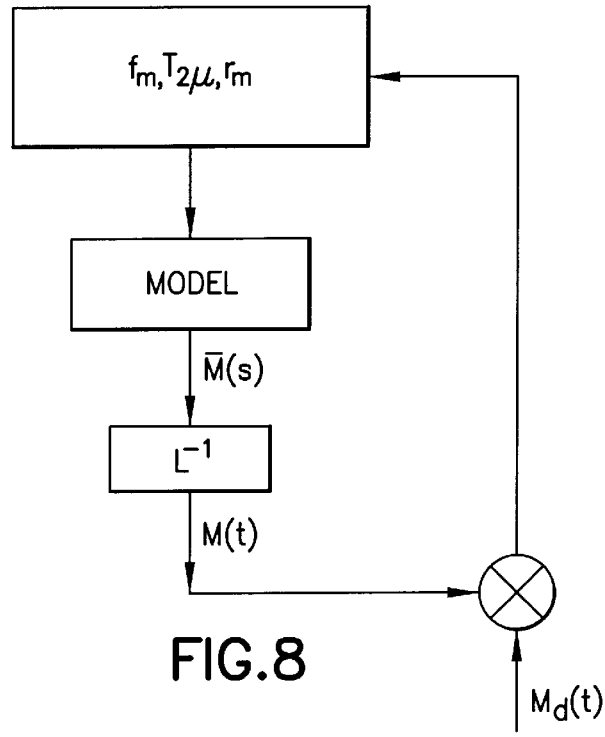
FIG. 8 depicts a schematic of a sample inversion scheme. Here the underlying model is specified in terms of three parameters: $f_m$, $T_{2\mu}$ and $r_m$, the radius of the macropore.

An example of the inversion scheme is presented in FIG. 8. This example assumes that φ is fixed. Start with an initialization for $T_{2\mu}$, $f_m$ and $V_{sm}$. The forward model is used to generate M(t). This is then compared with the measured relaxation $M_A(t)$. Depending on the error between the measured and the computed values, a correction to the guess is generated and the process iterated until an acceptable level of error is obtained. For the estimation of parameters, several standard methods are available. Among them are: The Gauss-Newton, the Levenberg-Marquardt, or their modifications. Another method of inversion utilizes simulated annealing (see Press, W. H., NUMERICAL RECIPES FOR FORTRAN, Cambridge University Press (1992)). Likelihood function evaluation on a grid of values of the parameters, or Markov-chain Monte Carlo integration, are alternative possibilities. Any of these techniques may be considered. The uncertainty in the estimates can be output.

Outputs

The output parameters are directly understandable from geometrical considerations. Accordingly, a porosity breakdown into $f_m$ and $\phi-f_m$ is available and can be shown vs. depth.

Using a value of ρ, $T_{2\mu}$ can be converted to an equivalent pore size. A continuous plot of φ vs. pore size for the two components of porosity can be displayed.

Once the model parameters are obtained, the resulting M(t) from the model can be inverted using the same regularization parameter as in the original data to show the difference between model based inversion and the direct processing of data.

The model based M(t) and the actual data can also be displayed.

A stick plot (FIG. 7) can also be presented for each of the inversions.

The model inverted parameters can be used in estimation of transport properties, since they are of geometrical nature. In particular, because $V_{sm}$ and $T_{2\mu}$ are related to absolute pore sizes, the inverted parameters can be used to estimate fluid permeability.

REFERENCES/FOOTNOTES

1. Brigham, W. E., Reed, P. W. and Dew, J. N., "Experiments on mixing during miscible displacement in porous media", *Soc. Pet. Eng. J.* 1, 1 (1961).
2. Dunham, R. J., IN CLASSIFICATION OF CARBONATE ROCKS ACCORDING TO DEPOSITIONAL TEXTURE IN CLASSIFICATION OF CARBONATE ROCKS-A SYMPOSIUM (ed. W. E. Ham), vol. 1, p. 108 *Am. Assoc. Petroleum Geologists Mem.*, Tulsa. (1962).
3. Schwartz, L., Hurlimann, M. D., Dunn K. J., Mitra P. P., Bergman, D., *J. Phys. Rev.* E55, 4225 (1997).
4. Roberts J. N. Schwartz L., *Phys. Rev.* B31, 5190 (1985).
5. Schwartz L., Kimminau S., *Geophysics* 52, 1402 (1987).
6. Zheng L. H>, Chew Y. C. J., *Chem. Phys.* 90, 322 (1989).
7. Agmon N. J., Chem. Phys. 81, 3644 (1984).
8. Ramakrishnan T. S., Kuchuck F., Transport in Porous Media 10, 103 (1993).
9. Dubner H., Abate J., *Assn. Comp. Mach.* 15, 115 (1968).

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A method of interpreting Nuclear Magnetic Resonance (NMR) data to determine the pore geometry of microporous carbonate rock, by estimating porosity components and their volume to surface area ratios, comprising the steps of:
   a) obtaining a measurement of a transverse magnetization relaxation decay curve, $M_A(t)$;
   b) utilizing a parameterized physical model representing the pore geometry and diffusion of magnetization between pore components in order to predict magnetization, M(t); and
   c) inferring porosity components of microporous carbonate rock and their relevant volume to surface area ratios or pore sizes by comparing said magnetization M(t) with said transverse magnetization relaxation decay curve, $M_A(t)$.

2. The method of interpreting NMR data in accordance with claim 1, further including the step of:
   d) utilizing a numerical random walk simulation technique in solving steps (b) and (c).

3. The method of interpreting NMR data in accordance with claim 1, further including the step of:
   e) utilizing eigenfunction methods in solving steps (b) and (c).

4. The method of interpreting NMR data in accordance with claim 1, further including the step of:
   f) utilizing a numerical inverse Laplace transformation in solving steps (b) and (c).

5. The method of interpreting NMR data in accordance with claim 1, wherein said pore geometry is for grain supported carbonate rock.

6. A method of interpreting Nuclear Magnetic Resonance (NMR) data to determine pore geometry in microporous carbonate rock, by estimating porosity components and their volume to surface area ratios, comprising the steps of:
   a) obtaining a transverse magnetization relaxation decay curve, $M_A(t)$;
   b) selecting an appropriate solution method to predict magnetization, M(t) for the geometrical model and account for diffusion of magnetization between pore components; and
   c) inferring pore geometry of microporous carbonate rock by comparing said magnetization M(t) with said transverse magnetization relaxation decay curve, $M_A(t)$.

7. The method of interpreting NMR data in accordance with claim 6, further including the step of:

d) estimating parameters for said geometrical model.

8. The method of interpreting NMR data in accordance with claim 7, wherein said estimating step (d) further includes the step of:

e) utilizing Gauss-Newton methods.

9. The method of interpreting NMR data in accordance with claim 7, wherein said estimating step (d) further includes the step of:

e) utilizing Levenberg-Marquardt methods.

10. The method of interpreting NMR data in accordance with claim 7, wherein said estimating step (d), further includes the step of:

e) utilizing simulated annealing methods.

11. The method of interpreting NMR data in accordance with claim 7, wherein said estimating step (d) further includes the step of:

e) utilizing likelihood function evaluation on a grid of values of the parameters.

12. The method of interpreting NMR data in accordance with claim 7, wherein said estimating step (d) further includes the step of:

e) utilizing Markov-chain Monte Carlo integration methods.

13. The method of interpreting NMR data in accordance with claim 6, further including the step of:

d) utilizing an inversion scheme for the geometrical model.

14. The method of interpreting NMR data in accordance with claim 6, wherein said geometrical model comprises a linear geometry.

15. The method of interpreting NMR data in accordance with claim 6, wherein said geometrical model comprises a spherical geometry.

16. The method of interpreting NMR data in accordance with claim 6, wherein said geometrical model comprises an ellipsoidal geometry.

17. The method of interpreting NMR data in accordance with claim 6, wherein said geometrical model comprises an cylindrical geometry.

18. The method of interpreting NMR data in accordance with claim 6, wherein said geometrical model is based on an elliptical geometry.

19. The method of interpreting NMR data in accordance with claim 6, wherein said pore structure is for carbonate rock.

* * * * *